(12) United States Patent
Yamashita et al.

(10) Patent No.: US 7,883,378 B2
(45) Date of Patent: Feb. 8, 2011

(54) ELECTRONIC DEVICE AND ON-VEHICLE MODULE

(75) Inventors: Shiro Yamashita, Fujisawa (JP); Hideto Yoshinari, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 121 days.

(21) Appl. No.: 12/285,893

(22) Filed: Oct. 16, 2008

(65) Prior Publication Data

US 2009/0233468 A1    Sep. 17, 2009

(30) Foreign Application Priority Data

Mar. 12, 2008  (JP) .............................. 2008-062000

(51) Int. Cl.
   *H01R 13/42* (2006.01)
(52) U.S. Cl. .......................... 439/751; 439/75; 439/941
(58) Field of Classification Search ................... 439/45, 439/48, 75, 78, 82, 733.1, 751, 941
   See application file for complete search history.

(56) References Cited

U.S. PATENT DOCUMENTS

| | | | | |
|---|---|---|---|---|
| 3,573,707 A | * | 4/1971 | Reynolds | 174/263 |
| 4,076,355 A | * | 2/1978 | Olsson et al. | 439/82 |
| 4,634,198 A | * | 1/1987 | Rush | 439/82 |
| 4,958,743 A | * | 9/1990 | Hatton et al. | 220/288 |
| 5,073,119 A | * | 12/1991 | Soes | 439/82 |
| 6,093,048 A | * | 7/2000 | Arnett et al. | 439/404 |
| 6,142,794 A | * | 11/2000 | Amberg | 439/82 |
| 6,305,949 B1 | * | 10/2001 | Okuyama et al. | 439/75 |
| 6,428,329 B2 | * | 8/2002 | Orui et al. | 439/75 |
| 7,255,612 B2 | * | 8/2007 | Noguchi | 439/751 |
| 2008/0203420 A1 | * | 8/2008 | Higaki et al. | 257/99 |
| 2009/0233468 A1 | * | 9/2009 | Yamashita et al. | 439/82 |

FOREIGN PATENT DOCUMENTS

| | | |
|---|---|---|
| JP | 2005-268422 | 9/2005 |
| JP | 2006-086428 | 3/2006 |
| JP | 2006-140383 | 6/2006 |

* cited by examiner

*Primary Examiner*—James Harvey
(74) *Attorney, Agent, or Firm*—Antonelli, Terry, Stout & Kraus, LLP.

(57) ABSTRACT

In a module, press-fit connection using a pin terminal including a connection part separated into two parts and a flat plane parallel to the lengthwise direction in the separation part and perpendicular to the separation direction of the pin terminal is performed. A through-hole of a board is structured so that an inner diameter of the through-hole at a middle part in the thickness direction of the board is smaller than that at obverse and reverse surfaces of the board and the length of the middle part of the through-hole connected to the pin terminal is shorter than the length of the flat plane of the pin terminal.

16 Claims, 6 Drawing Sheets

$T_p$: LENGTH OF SUBSTANTIALLY FLAT PLANE OF PIN TERMINAL > $T_c$: LENGTH OF SUBSTANTIALLY FLAT PLANE OF MIDDLE PART OF BOARD
$T_e$: INNER DIAMETER AT MIDDLE PART OF THROUGH-HOLE < $T_s$: INNER DIAMETER AT SURFACE OF BOARD,
$T_b$: INNER DIAMETER AT REVERSE SURFACE OF BOARD

FIG.1A
PRIOR ART

PRESS-FIT PIN TERMINAL
INTO THROUGH-HOLE
TO CONNECT THEM

CONNECTION PARTS ARE SEPARATED AND EXIST AT UPPER AND LOWER ENDS OF PIN TERMINAL

FIG.5

CONCENTRATE CONNECTION PART IN NARROW RANGE $T_p$ : LENGTH OF SUBSTANTIALLY FLAT PLANE OF PIN TERMINAL > $T_c$ : LENGTH OF SUBSTANTIALLY FLAT PLANE OF MIDDLE PART OF BOARD
$T_e$ : INNER DIAMETER AT MIDDLE PART OF THROUGH - HOLE < $T_s$ : INNER DIAMETER AT SURFACE OF BOARD,
$T_b$ : INNER DIAMETER AT REVERSE SURFACE OF BOARD

ELECTRONIC DEVICE AND ON-VEHICLE MODULE

BACKGROUND OF THE INVENTION

The present invention relates to an electronic device and particularly an on-vehicle module provided with a board having through-holes to which pin terminals (wiring pins and connector pins) of another substrate or module are connected in a press-fit manner.

Figure 1A:
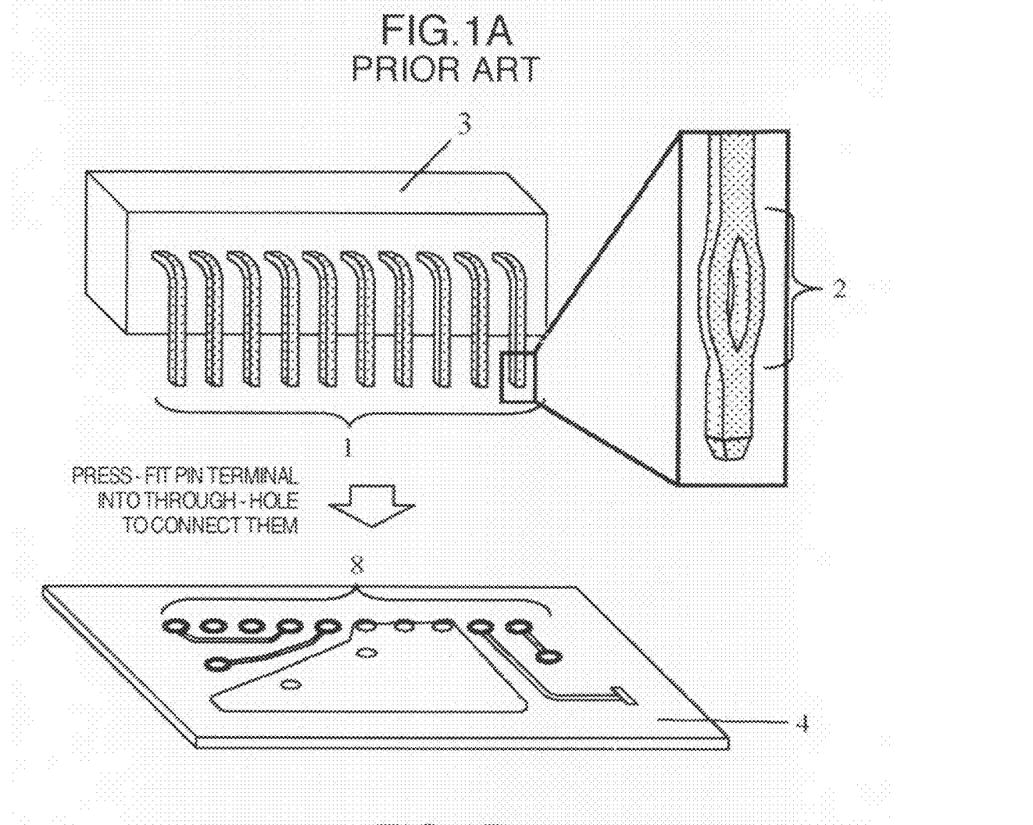
FIG. 1A is a schematic diagram showing an example of a press-fit connector to be connected to through-holes of a board.
Figure 1B:
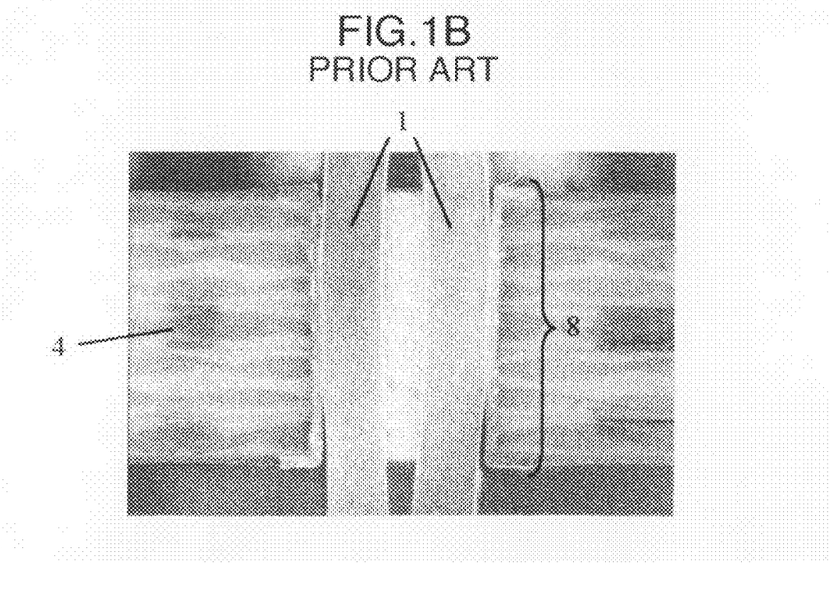
FIG. 1B shows a sectional SEM (Scanning Electron Microscope) photograph near a through-hole into which a pin terminal is press-fit.

Recently, as a connection form in case where components are mounted on a board in which electrical wiring is formed, the press-fit connection is increasingly being adopted in which as shown in FIG. 1A a plurality of pin terminals 1 mounted in a press-fit connector 3 of a component are press-fit into a plurality of through-holes 8 formed in a board 4 so that the pin terminals 1 are mechanically connected to wiring in the through-holes 8 to thereby make electrical connection therebetween. Since an outer diameter of a connection part 2 of each pin terminal 1 is larger than an inner diameter of each through-hole and the connection part is resiliently deformed by external force, the outer diameter of the connection part of the pin terminal 1 is reduced by the through-hole when the pin terminal 1 is press-fit into the through-hole and at the same time the restoring force of the connection part acts to expand the pin terminal. Consequently, the surface of the connection part of the pin terminal comes into mechanical contact with the wiring in the through-hole as shown by a sectional photograph of FIG. 1B to thereby make electrical connection therebetween as shown in FIGS. 1A and 1B as an example of the press-fit connection.

The following is being studied about the press-fit connection. For example, in JP-A-2005-268422 and JP-A-2006-86428, in order to cope with the problem that plating formed at the surface of the pin terminal comes off to short circuits on a board when the pin terminal is press-fit into the through-hole, an entrance part at a press-fit end of through-hole is chamfered to thereby prevent plating from scraping off. In JP-A-2006-140383, in order to cope with scraping off or whitening occurring in a board by restoring force of pin terminal when the pin terminal is press-fit into a through-hole, a buffer member is disposed at an entrance of the through-hole of the board to deform a connection part of the pin terminal by the buffer member before the connection part of the pin terminal is press-fit into the through-hole, so that scraping off or whitening of the board is prevented.

SUMMARY OF THE INVENTION

Figure 2:
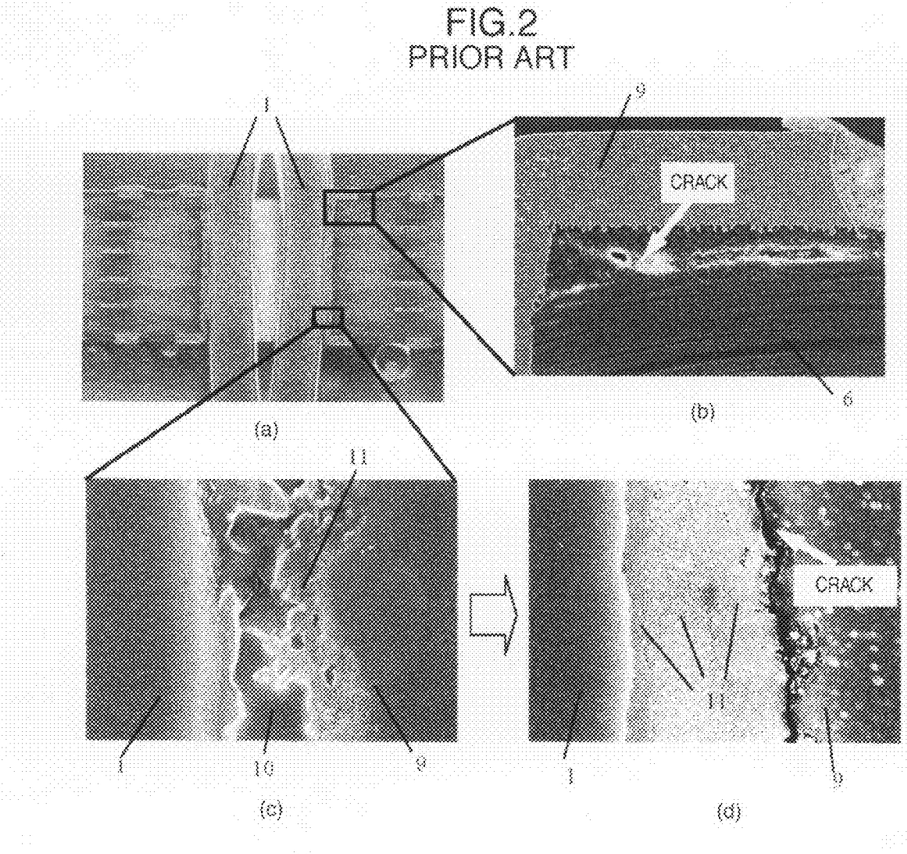

However, in the above-mentioned prior art, attention is paid to the problems occurring upon the press-fit connection but the connection reliability thereof is not sufficiently studied. The inventors pay attention to the high reliability of the press-fit connection and have performed various studies. FIG. 2(a) shows a sectional SEM (Scanning Electron Microscope) photograph of the connection part after the pin terminal 1 is press-fit into the through-hole and FIG. 2(b) shows the vicinity of the through-hole of the board on an enlarged scale. As shown in FIG. 2(b), delamination in insulating resin 6 can be confirmed in the vicinity of the through-hole, although it is considered that the reason thereof is that large force is exerted on an entrance on the press-fit side of the through-hole upon press-fit connection since the inner diameter of the through-hole into which the pin terminal is press-fit in the press-fit connection is smaller than the outer diameter of the pin terminal. When there is the delamination in the insulating resin, it is apprehended that migration occurs after long operation and the reliability of the board is considered to be reduced greatly.

FIG. 2(c) shows a sectional SEM photograph of an interface at connection part just after the pin terminal is press-fit into the through-hole and FIG. 2(d) shows a sectional SEM photograph of the interface at connection part after heat cycle test is performed after the press-fit connection of the pin terminal. The surface of the pin terminal 1 is subjected to plating 10 with Sn system from a viewpoint of preventing corrosion and as understood from FIG. 2(c) the plating 10 with Sn system on the surface reacts with Cu formed on an inner wall of the through-hole as wiring 9 within the through-hole to form a compound 11 of Sn—Cu. The press-fit connection is generally said as contact connection and it is understood that a compound is formed at the interface between the connection part of the pin terminal and the inner wall of the through-hole so that metallic junction is formed. However, formation of the compound is advanced after the heat cycle test and delamination is formed at the interface as shown in FIG. 2(d), so that it is apprehended that resistance value is increased due to delamination and reduction in reliability of connection is considered consequently.

Moreover, in order to attain high reliability of the press-fit connection, it is necessary to have the structure that the pin terminal is easily inserted into the through-hole but the inserted pin terminal is difficult to come out from the through-hole.

As described above, in order to realize the high reliability of the press-fit connection after connection, it is necessary to study the press-fit connection collectively in consideration of not only prevention of plating from scraping off and delamination of the board upon connection but also prevention of delamination at the interface of connection and structure that the inserted pin terminal is difficult to come out from the through-hole.

However, in JP-A-2005-268422, since a flat part is not provided in the connection part of the pin terminal, the pin terminal is easy to come out from the through-hole. Furthermore, in JP-A-2006-86428 and JP-A-2006-140383, measures for delamination at the interface are not taken and the reliability of connection is low.

It is an object of the present invention to solve the above problems by providing an electronic device having press-fit connection structure having high reliability of connection. Moreover, it is an object of the present invention to provide an on-vehicle module having press-fit connection structure which can be applied to a vehicle-mounted use in which high reliability of connection is required since it is used under high-temperature surroundings.

Figures 3A, 3B:
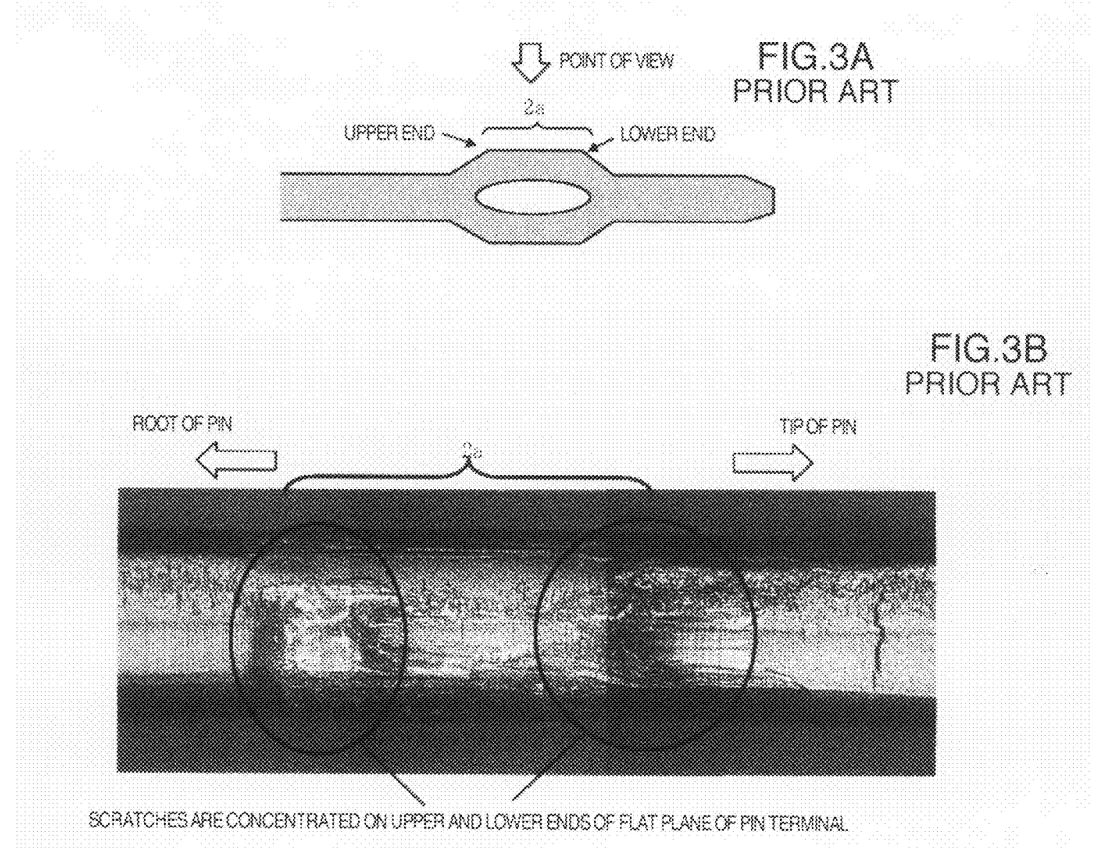
FIG. 3A shows a pin terminal studied in the present invention.
FIG. 3B shows a photograph showing the surface of the pin terminal of FIG. 3A extracted from the usual cylindrical through-hole after the pin terminal is once press-fit into the through-hole.

The inventors have observed the surface of a pin terminal which was once press-fit into a usual cylindrical through-hole and was then pulled out therefrom in order to study the problem of occurrence of delamination at the interface. Consequently, as shown in FIGS. 3A and 3B, the inventors understand that scratches in plating are formed at part on the surface of the pin terminal considered to be connected to the through-hole and the scratches are concentrated at upper and lower ends of substantially flat plane 2a of the pin terminal. In other words, it is considered that when the pin terminal is press-fit into the usual cylindrical through-hole, connection is made at only two upper and lower ends of the substantially flat plane of the pin terminal.

Figure 4:
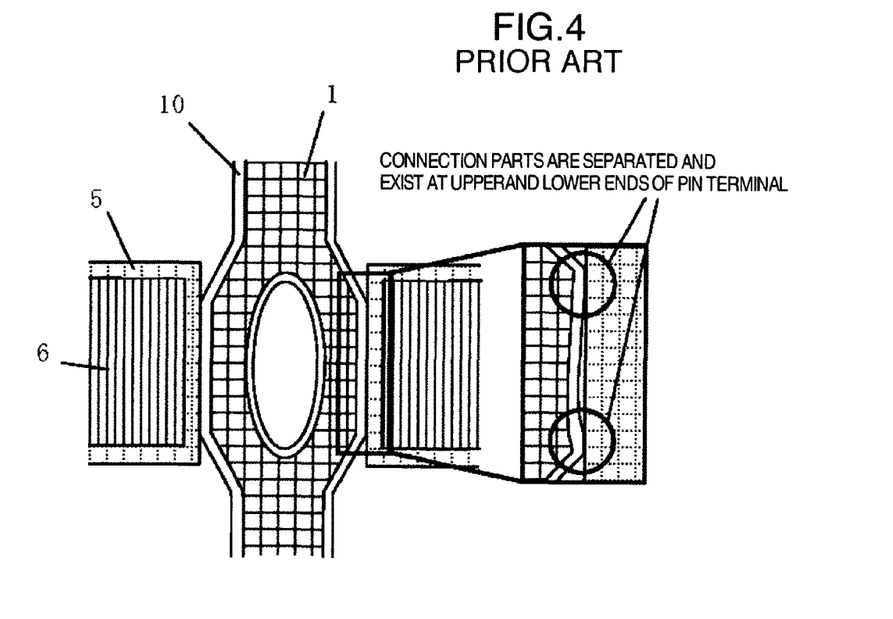
FIG. 4 is a schematic diagram showing a connection state of the pin terminal studied in the present invention press-fit into the usual cylindrical through-hole.

This connection state is described by using a schematic diagram as shown in FIG. 4 in which the pin terminal 1 having a layer of plating 10 with Sn system formed at the surface thereof is press-fit into a through-hole of a board having wiring 5 of Cu formed on the surface of an insulating resin 6 and an inner wall of the through-hole. In such connection state, load on connection interface is increased by heat cycle test. In other words, thermal stress occurs at the connection interface due to difference in coefficient of linear expansion between the pin terminal and the through-hole upon heat cycle test and when main connection parts are separated as shown in FIG. 4, the connection interface is easily influenced by the difference in coefficient of linear expansion in the thickness direction of the board (in the lengthwise direction of the pin terminal), so that load on the connection interface is increased. Consequently, it is considered that delamination occurs at the connection interface.

Accordingly, in the present invention, the length of the part to be brought into contact with the pin terminal at the center portion of the through-hole is made shorter than that of the substantially flat plane of the pin terminal, so that the connection part of the pin terminal and the inner wall of the through-hole can be concentrated in a narrow range to reduce influence of the difference in the coefficient of linear expansion in the thickness direction of the board (in the lengthwise direction of the pin terminal). Consequently, occurrence of delamination at the interface can be suppressed and the reliability of the connection part can be improved.

Furthermore, it is considered that the structure of the connection part of the pin terminal can be made small in order to reduce the difference in the coefficient of linear expansion, although since the connection part of the pin terminal is resiliently deformed when the pin terminal is press-fit into the through-hole to thereby be brought into mechanical contact with wiring in the through-hole and electrically connected thereto, the connection part is required to be longer to the some degree in order to get the structure apt to be resiliently deformed as compared with other parts of the pin terminal. Accordingly, this is not effective.

Moreover, with regard to the shape of the through-hole, the peripheral edge part of an opening of the through-hole is chamfered and the through-hole is tapered so that the inner diameter of the through-hole is gradually increased from a middle part thereof to the surface of the board on the press-fit side, so that influence of the restoring force of the pin terminal on the board upon the press-fit connection of the pin terminal can be relieved and prevention of scraping off of the plating at the surface of the pin terminal and reduction of delamination occurring in the board can be attained. Particularly, the peripheral edge parts of the opening at not only the obverse surface of the board but also the reverse side thereof can be chamfered to suppress warp of the board due to offset of the connection portions between the connection part of the pin terminal and the inner wall of the through-hole.

Furthermore, since the connection part of the pin terminal is formed to have the substantially flat plane so that the connection part of the press-fit pin terminal is deformed to be bent convexly toward the inside of the pin terminal, the pin terminal is difficult to come out from the through-hole and holding force can be increased. Particularly, by combining with the through-hole having the shape that the length of the part to be connected to the pin terminal at the middle part of the through-hole is shorter than that of the substantially flat plane of the pin terminal, the pin terminal can be made more difficult to come out from the through-hole and larger holding force can be gotten.

Representative aspects of the present invention are described briefly as follows:

(1) An electronic device includes a module electrically connected to a pin terminal and a wiring board having a through-hole in which the pin terminal are inserted. The pin terminal has a substantially flat plane having at least a part thereof to be brought into contact with conductive member disposed on an inner wall of the through-hole and the inner wall of the through-hole has a substantially flat plane to be brought into contact with the substantially flat plane of the pin terminal in opposing relationship to the substantially flat plane of the pin terminal. The length of the substantially flat plane at the inner wall of the through-hole in the thickness direction of the wiring board is shorter than that of the substantially flat plane of the pin terminal in the thickness direction of the wiring board.

(2) The electronic device described in (1) has peripheral edge part of the through-hole of the board on the insertion side of the pin terminal which is chamfered at a predetermined angle to the substantially flat plane of the inner wall of the through-hole.

(3) An on-vehicle module includes a power module, a wiring board having a through-hole into which a pin terminal electrically connected to the power module is inserted and a base board in which the wiring board is mounted. The pin terminal has a substantially flat plane having at least a part thereof to be brought into contact with conductive member disposed on an inner wall of the through-hole and the inner wall of the through-hole has a substantially flat plane to be brought into contact with the substantially flat plane of the pin terminal in opposing relationship to the substantially flat plane of the pin terminal. The length of the substantially flat plane at the inner wall of the through-hole in the thickness direction of the wiring board is shorter than that of the substantially flat plane of the pin terminal in the thickness direction of the wiring board.

(4) An electronic device includes a first board having a first wiring layer and a through-hole electrically connected to the first wiring layer and a second board having a pin terminal containing a substantially flat plane formed in a connection part which is resiliently deformed easier than other parts and a second wiring layer electrically connected to the pin terminal. The electronic device has press-fit connection structure formed by press-fit the connection part of the pin terminal into the through-hole of the first board. The inner diameter of the through-hole of the first board at the connection part thereof positioned at a middle part in the thickness direction of the first board is smaller than the inner diameter at observe and reverse surfaces of the first board and the length of the middle part having the small inner diameter in the thickness direction of the first board is shorter than the length of the substantially flat plane of the pin terminal in the thickness direction of the first board.

These and other objects, features and advantages of the invention will be apparent from the following more particular description of preferred embodiments of the invention, as illustrated in the accompanying drawings.

BRIEF DESCRIPTION OF THE DRAWINGS

FIG. 2(*a*) shows a sectional SEM photograph showing a through-hole and the vicinity thereof in a board having delamination occurring in an insulating resin after a pin terminal is press-fit into the through-hole;

FIG. 2(b) shows an enlarged photograph of FIG. 2(a) in which the delamination shown in FIG. 2(a) is enlarged;

FIG. 2(c) shows an enlarged photograph showing a connecting portion of a connection part of the pin terminal and an inner wall of the through-hole;

FIG. 2(d) shows an enlarged photograph of FIG. 2(c) after a heat cycle test is performed;

DESCRIPTION OF THE EMBODIMENTS

The press-fit connection structure in an electronic device according to the present invention is now described in detail with reference to FIGS. 5 to 8. A connection part 2 at the tip of a pin terminal is structured to be resiliently deformed when the pin terminal is press-fit into a through-hole so as to be brought into contact with an inner wall of the through-hole and has two-separated structure as shown in FIG. 6. A substantially flat plane 2a positioned outside the separated part is substantially parallel to the lengthwise direction of the pin terminal and is formed substantially vertically to the separation direction. As far as the connection part has a substantially flat plane and can be deformed resiliently in a predetermined manner, the structure of the connection part is not limited to the two-separated structure and a four-separated structure or other structure may be used.

Figure 6:
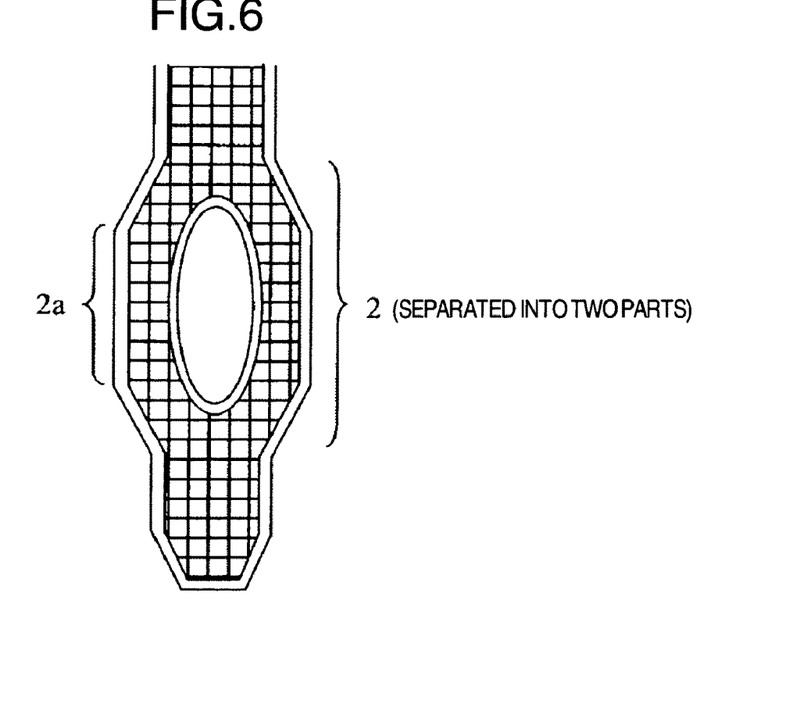
FIG. 6 shows basic structure of a connection part of a pin terminal according to the present invention.
Figure 7A:
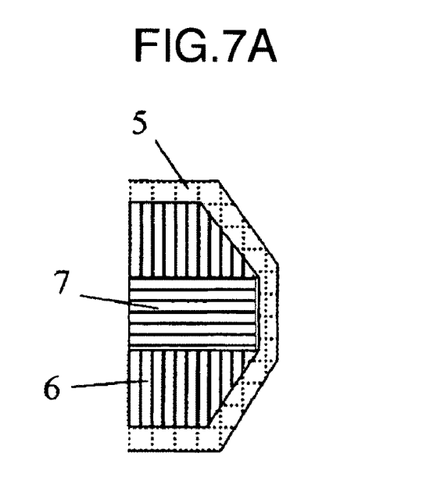
FIGS. 7A and 7B show a first embodiment of through-hole structure according to the present invention.
Figure 7B:
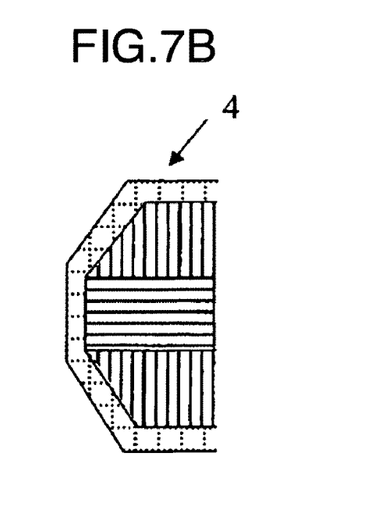

On the other hand, a board having the through-hole includes, as shown in FIGS. 7A and 7B, core material 7, insulating resin 6 formed on both sides of the core material 7 and Cu wiring 5 provided on the surface of the insulating resin 6 and on an inner wall of the through-hole. The part of the core material 7 of the board is to be connected to the pin terminal and the inner diameter of the part of the core material 7 of the through-hole plated with Cu is smaller than the outer diameter of the two-separated connection part 2 of the pin connector shown in FIG. 6. The core material can be worked in consideration of the thickness of the plating with Cu to thereby design an optimum inner diameter. The length of the core material part plated with Cu in the thickness direction of the board and connected to the pin terminal is required to be shorter than the length of the substantially flat plane 2a of the connection part 2 of the pin terminal shown in FIG. 6 in the lengthwise direction of the pin terminal. Furthermore, other layers of the board are formed so that the inner diameter is increased from the part of the core material 7 toward obverse and reverse surfaces of the board in a tapered manner.

Figure 5:
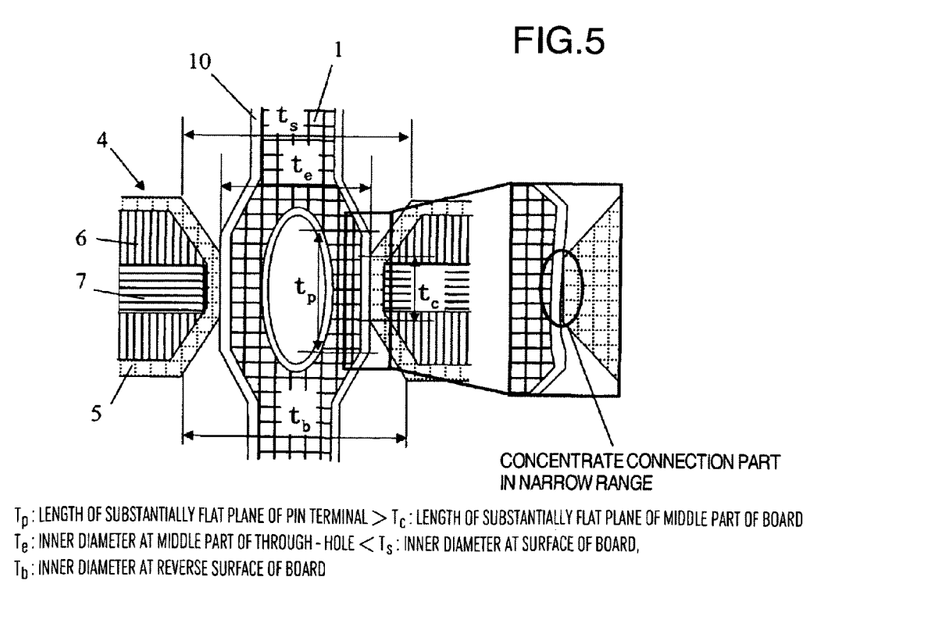
FIG. 5 shows basic structure of press-fit connection according to the present invention.

FIG. 5 shows the press-fit connection structure according to the present invention in which the pin terminal 1 is press-fit into the through-hole formed in the board. As described above, the length tc of the substantially flat plane of the part of the core material 7 plated with Cu opposite to the pin terminal is made shorter than the length tp of the substantially flat plane of the connection part of the pin terminal, so that the connection portion can be concentrated on a narrow range. That is, such structure can reduce influence of difference in the coefficient of linear expansion in the thickness direction of the board 4 (in the lengthwise direction of the pin terminal) and can suppress occurrence of delamination at the interface to thereby improve the reliability of the press-fit connection. Moreover, as shown in FIG. 5, the inner diameter te of the middle part of the through-hole is made smaller than the inner diameters ts and te at the obverse and reverse surfaces of the board 4, so that scraping off of plating and delamination of the board occurring upon press-fit connection of the pin terminal can be prevented and disadvantage due to warp of the board can be prevented.

Figure 8A:
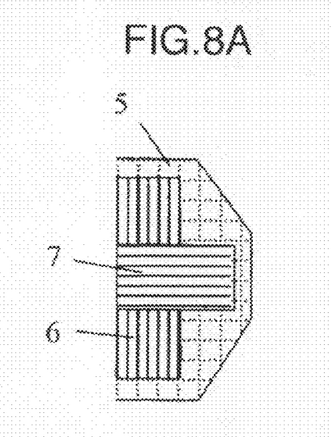
FIGS. 8A and 8B show a second embodiment of through-hole structure according to the present invention.
Figure 8B:
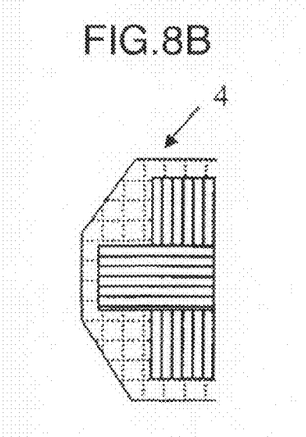

In the embodiment, the board 4 has the core material 7 disposed in the middle portion and the insulating resin 6 having the chamfered part by way of example, although the board is not limited thereto and may be any shape as far as there is the above-mentioned length relation between the board and the connection part of the pin terminal. For example, as shown in FIG. 8, insulating resins 6 having the inner diameter larger than that of the part of the core material 7 of the board 4 may be disposed on both sides of the core material 7 and the Cu wiring 5 is formed so that the inner diameter is gradually increased from the part of the core material 7 toward the obverse and reverse surfaces of the board in a tapered manner. The board 4 may be formed by the insulating resin 6 and the Cu wiring 5 without using the core material 7. Further, the wiring 5 formed on the obverse and reverse surfaces of the board and the inner wall of the through-hole is not limited to be made of Cu and it may be changed to Al or the like variously.

An experimental result for verification about the connection reliability having the structure in which the board having the structure shown in FIGS. 7A and 7B and the pin terminal having the above-mentioned length relation are connected in a press-fit manner is described as an experimental example 1 and that in case where the board having the structure shown in FIGS. 8A and 8B is used is described as an experimental example 2.

EXPERIMENTAL EXAMPLE 1

The pin terminal was made of P bronze and had the external shape of 1.2 mm (in the separation direction)×0.65 mm (in the thickness direction) and the length of the flat plane of 0.75 mm. The surface of the pin terminal was plated with Sn. The board had the thickness of 1.6 mm and the thickness of the portion connected to the pin terminal, of the core material of the through-hole, was equal to about 0.5 mm. The inner diameter of the through-hole was gradually increased from the core material toward the obverse and reverse surfaces of the board in a tapered manner.

As a result of observation of the external appearance for a test piece after the pin terminal was press-fit, the flat plane of the pin terminal was deformed to be bent convexly toward the inside of the pin terminal. As a result of observation of the section of the through-hole, delamination and whitening phenomenon were not found in the insulating resin near the through-hole. Furthermore, Sn of plating and Cu of through-hole were reacted with each other to form Sn—Cu compound in the connection portion of the pin terminal and the through-hole. After the test piece was subjected to heat cycle test of −40/130° C. and 3000 cycles, the section was observed again. At this time, delamination and whitening phenomenon were not found in the insulating resin near the through-hole in the same manner as after the through-hole was subjected to press-fitting. Moreover, delamination was not found even in Sn—Cu compound existing in the connection portion of the pin terminal and the through-hole.

Further, a test piece in case where the same pin terminal was press-fit into a usual cylindrical through-hole was studied for reference. As a result of observation of the section, delamination was found in the insulating resin near the through-hole after the pin terminal was press-fit into the through-hole and delamination was found in Sn—Cu compound existing in the connection portion of the pin terminal and the through-hole after heat cycle test was performed.

EXPERIMENTAL EXAMPLE 2

The pin terminal had the same structure as described in the experimental example 1. The pin terminal was made of P bronze and had the external shape of 1.2 mm (in the separation direction)×0.65 mm (in the thickness direction) and the length of the flat plane of 0.75 mm. The surface of the pin terminal was plated with Sn. The board had the thickness of 1.6 mm and the thickness of the portion connected to the pin terminal of the core material of the through-hole was equal to about 0.5 mm. The inner diameter of the through-hole was gradually increased from the core material toward the obverse and reverse surfaces of the board in a tapered manner.

As a result of observation of the external appearance for a test piece after the pin terminal was press-fit into the through-hole, the flat plane of the pin terminal was deformed to be bent convexly toward the inside of the pin terminal. As a result of observation of the section of the through-hole, delamination and whitening phenomenon were not found in the insulating resin near the through-hole. Furthermore, Sn of plating and Cu of through-hole were reacted with each other to form Sn—Cu compound in the connection portion of the pin terminal and the through-hole. After the test piece was subjected to heat cycle test of −40/130° C. and 3000 cycles, the section was observed again. At this time, delamination and whitening phenomenon were not found in the insulating resin near the through-hole in the same manner as after the through-hole was subjected to press-fitting. Moreover, delamination was not found even in Sn—Cu compound existing in the connection portion of the pin terminal and the through-hole.

Further, a test piece in case where the same pin terminal was press-fit into a usual cylindrical through-hole was studied for reference. As a result of observation of the section, delamination was found in the insulating resin near the through-hole after the pin terminal was press-fit into the through-hole and delamination was found in Sn—Cu compound existing in the connection portion of the pin terminal and the through-hole after heat cycle test was performed.

According to the embodiment of the present invention, it is understood from the above experimental result that the press-fit connection having high reliability of connection that delamination is suppressed from occurring in the board can be gotten.

Figure 9:
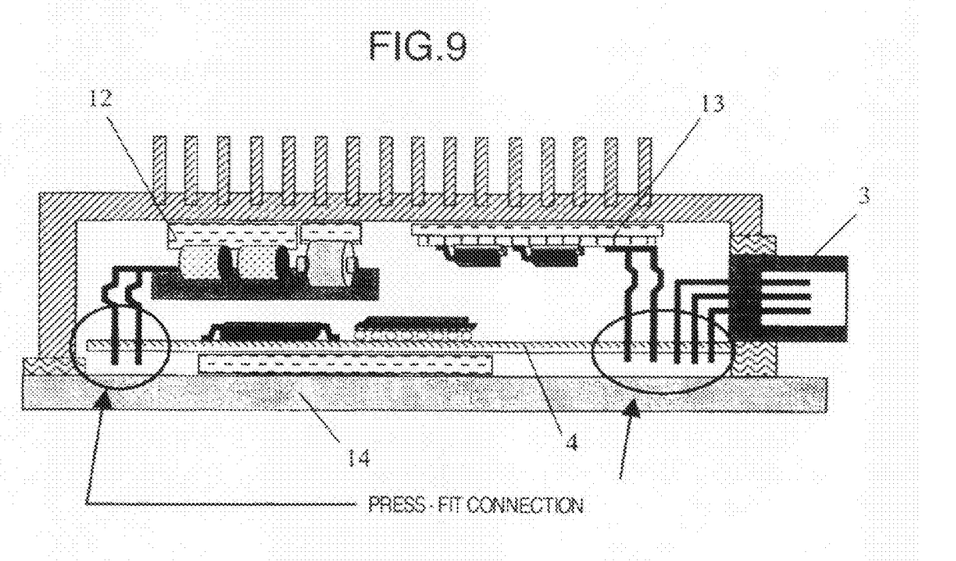
FIG. 9 is a schematic diagram showing an on-vehicle module to which press-fit connection structure according to the present invention is applied.

The electronic device according to the present invention using the press-fit connection is now described by taking an on-vehicle module as an example. The on-vehicle module according to the present invention includes, as shown in FIG. 9, a plurality of pin terminals inserted into a plurality of through-holes of the wiring board 4 mounted on a base board 14, an LC modules 12, a power module 13 and a press-fit connector 3 constituting an external connection terminal to which the plurality of pin terminals are electrically connected. The connection structure according to the present invention described above as the press-fit connection is applied to the on-vehicle module, so that the on-vehicle module having high reliability of the press-fit connection and preventing reduction of the life can be realized. The press-fit connection structure according to the present invention is used for connection of the LC module 12 and the like to the wiring board 4 as a representative example, although the press-fit connection structure is not limited thereto and can be applied to other internal modules. Moreover, the press-fit connection structure can be applied to not only connection between module and board but also connection between board and board and it is needless to say that the press-fit connection can be applied to any product.

According to the present invention, there can be provided the electronic device having the press-fit connection structure with high reliability of connection. Moreover, there can be provided the on-vehicle module having the press-fit connection structure capable of being applied even to vehicles requiring high connection reliability since it is used under high temperature surroundings.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. An electronic device including a first board having a first wiring layer and a through-hole electrically connected to the first wiring layer and an external connection terminal having a pin terminal having a substantially flat plane provided in a connection part which is resiliently deformed easier than other parts, the electronic device having press-fit connection structure formed by press-fitting the connection part of the pin terminal into the through-hole of the first board, wherein
    an inner diameter of the through-hole of the first board at a connection part positioned at a middle part in a thickness direction of the first board is smaller than that at obverse and reverse surfaces of the first board,
    a length of the middle part having the smaller inner diameter in the thickness direction of the first board is shorter than a length of the substantially flat plane of the pin terminal in the thickness direction of the first board,
    a peripheral edge part of the through-hole of the first board on the insertion side of the in terminal is chamfered at a predetermined angle to the substantially flat plane of the inner wall of the through-hole, and
    a peripheral edge part of the through-hole of the first board on a reverse side to the insertion side of the in terminal is chamfered at a predetermined angle to the substantially flat plane of the inner wall of the through-hole.

2. An electronic device according to claim 1, wherein the external connection terminal is a press-fit connector.

3. An electronic device including a module electrically connected to a in terminal and a wiring board having a through-hole into which the in terminal is inserted, wherein
    the pin terminal includes a substantially flat plane having at least a part to be brought into contact with a conductive member disposed on an inner wall of the through-hole,
    the inner wall of the through-hole includes a substantially flat plane to be brought into contact with the substantially flat plane of the in terminal in opposing relationship thereto, a length of the substantially flat plane of the inner wall of the through-hole in a thickness direction of the wiring board being shorter than a length of the substantially flat plane of the in terminal in the thickness direction of the wiring board;

a peripheral edge part of the through-hole of the wiring board on an insertion side of the in terminal is chamfered at a predetermined angle to the substantially flat plane of the inner wall of the through-hole, and a peripheral edge part of the through-hole of the wiring board on a reverse side to the insertion side of the pin terminal is chamfered at a predetermined angle to the substantially flat plane of the inner wall of the through-hole.

4. An electronic device according to claim 3, wherein the board includes core material and insulating resin formed on both sides of the core material.

5. An electronic device according to claim 3, wherein a part having the substantially flat plane of the pin terminal is resiliently deformed easier than other parts.

6. An electronic device according to claim 3, wherein the pin terminal is a press-fit terminal.

7. An electronic device according to claim 3, wherein the module is a power module.

8. An electronic device according to claim 3, wherein the module is an LC module.

9. An on-vehicle module including a power module, a wiring board having a through-hole into which a pin terminal electrically connected to the power module is inserted and a base board in which the wiring board is mounted, wherein the pin terminal includes a substantially flat plane having at least a part to be brought into contact with a conductive member disposed on an inner wall of the through-hole, the inner wall of the through-hole includes a substantially flat plane to be brought into contact with the substantially flat plane of the pin terminal in opposing relationship thereto, a length of the substantially flat plane of the inner wall of the through-hole in a thickness direction of the wiring board being shorter than a length of the substantially flat plane of the pin terminal in the thickness direction of the wiring board, a peripheral edge part of the through-hole of the wiring board on an insertion side of the in terminal is chamfered at a predetermined angle to the substantially flat plane of the inner wall of the through-hole, a peripheral edge part of the through-hole of the wiring board on a reverse side to the insertion side of the in terminal is chamfered at a predetermined angle to the substantially flat plane of the inner wall of the through-hole.

10. An electronic device including a first board having a first wiring layer and a through-hole electrically connected to the first wiring layer and a second board having a pin terminal having a substantially flat plane provided in a connection part which is resiliently deformed easier than other parts and a second wiring layer electrically connected to the pin terminal, the electronic device having press-fit connection structure formed by press-fitting the connection part of the pin terminal into the through-hole of the first board, wherein an inner diameter of the through-hole of the first board at a connection part positioned at a middle part in a thickness direction of the first board is smaller than that at obverse and reverse surfaces of the first board, a length of the middle part having the smaller inner diameter in the thickness direction of the first board is shorter than a length of the substantially flat plane of the pin terminal in the thickness direction of the first board, a peripheral edge part of the through-hole of the first board on an insertion side of the in terminal is chamfered at a predetermined angle to the substantially flat plane of the inner wall of the through-hole, and a peripheral edge part of the through-hole of the first board on a reverse side to the insertion side of the in terminal is chamfered at a predetermined angle to the substantially flat plane of the inner wall of the through-hole.

11. An on-vehicle module according to claim 9, wherein a part having the substantially flat plane of the pin terminal is resiliently deformed easier than other parts.

12. An on-vehicle module according to claim 9, further comprising an LC module.

13. An electronic device according to claim 10, wherein the connection part of the pin terminal is separated into two parts, and the substantially flat plane of the connection part of the pin terminal is substantially parallel to a lengthwise direction of the pin terminal and substantially perpendicular to a separation direction.

14. An electronic device according to claim 10, wherein an insulating part of the first board is formed so that the through-hole of the first board has an inner diameter which is gradually increased from the middle part toward the obverse and reverse surfaces of the first board.

15. An electronic device according to claim 10, wherein the through-hole of the first board is formed with a conductive member electrically connected to the first wiring layer so that the inner diameter of the through-hole of the first board is gradually increased from the middle part thereof toward the obverse and reverse surfaces of the first board.

16. An electronic device according to claim 10, wherein outer diameters of the connection part of the pin terminal at upper and lower ends of the substantially flat plane is larger than the inner diameter of the middle part of the through-hole.

\* \* \* \* \*